(12) United States Patent
Li et al.

(10) Patent No.: US 12,604,606 B2
(45) Date of Patent: Apr. 14, 2026

(54) DISPLAY DEVICE

(71) Applicant: BEIJING XIAOMI MOBILE SOFTWARE CO., LTD., Beijing (CN)

(72) Inventors: Jian Li, Beijing (CN); Lei Tang, Beijing (CN); Xiao Xiang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 638 days.

(21) Appl. No.: 17/981,083

(22) Filed: Nov. 4, 2022

(65) Prior Publication Data

US 2024/0023363 A1     Jan. 18, 2024

(30) Foreign Application Priority Data

Jul. 18, 2022     (CN) .......................... 200021845387.5

(51) Int. Cl.
*H10K 50/842* (2023.01)
*H10K 50/822* (2023.01)
*H10K 50/828* (2023.01)
*H10K 59/126* (2023.01)

(52) U.S. Cl.
CPC ....... *H10K 50/8426* (2023.02); *H10K 50/822* (2023.02); *H10K 50/828* (2023.02); *H10K 59/126* (2023.02)

(58) Field of Classification Search
CPC ........... H10K 50/8426; H10K 59/8722; H10K 50/822; H10K 50/828; H10K 59/80521; H10K 59/80524; H10K 59/126; H10K 59/8792; H10K 59/00; H10K 50/865; H10K 59/40; H10K 77/111; H01L 23/60
See application file for complete search history.

(56) References Cited

U.S. PATENT DOCUMENTS

| | | | | |
|---|---|---|---|---|
| 12,439,809 B2* | 10/2025 | Lee | .................... | H10K 50/8426 |
| 2013/0181921 A1 | 7/2013 | Kuwajima et al. | | |
| 2014/0078701 A1 | 3/2014 | Tanabe et al. | | |
| 2014/0204290 A1 | 7/2014 | Chen et al. | | |

(Continued)

FOREIGN PATENT DOCUMENTS

CN          112909069 A        6/2021

OTHER PUBLICATIONS

Extended European Search Report of EP Application No. 22205769.7 dated Jul. 5, 2023, (9p).

*Primary Examiner* — Shahed Ahmed
*Assistant Examiner* — E. Rhett Cheek
(74) *Attorney, Agent, or Firm* — Arch & Lake LLP; Hao Tan; Shen Wang

(57)          ABSTRACT

A display device includes a cover glass, a display panel, a light-absorbing ink layer, and a transparent conductive layer. The cover glass is on a light-emitting side of the display panel, and includes a central light-transmitting area and a peripheral light-shielding area at a periphery of the central light-transmitting area. The light-absorbing ink layer is on a side of the cover glass adjacent to the display panel, and the light-absorbing ink layer is under the peripheral light-shielding area. The transparent conductive layer is between the cover glass and the display panel, and an orthogonal projection of the transparent conductive layer on the cover glass at least partially overlaps with an orthogonal projection of the light-absorbing ink layer on the cover glass.

17 Claims, 4 Drawing Sheets

(56)        References Cited

U.S. PATENT DOCUMENTS

| 2015/0049287 | A1  | 2/2015  | Chang et al. | |
| 2018/0033979 | A1* | 2/2018  | Jang | B32B 27/306 |
| 2018/0088631 | A1* | 3/2018  | Park | H04M 1/0266 |
| 2018/0136524 | A1  | 5/2018  | Ikegami et al. | |
| 2020/0381502 | A1* | 12/2020 | Song | H10K 59/126 |
| 2023/0217784 | A1* | 7/2023  | Yu | H10K 59/8722 |
| | | | | 257/40 |

* cited by examiner

DISPLAY DEVICE

CROSS-REFERENCE TO RELATED APPLICATION

The present application is based upon and claims priority to Chinese Application No. 202210845387.5, filed on Jul. 18, 2022, the entire content of which is incorporated herein by reference for all purposes.

BACKGROUND

With the development of display technology, display devices are used more and more widely. Common display devices include smart phones, tablet computers, televisions or monitors.

The display device usually includes a display panel, a light-absorbing ink layer, a cover glass and a housing. The light-absorbing ink layer is printed on a peripheral area of the cover glass, and a side of the light-absorbing ink layer facing away from the cover glass is bonded with the display panel. The display panel is mounted in the housing.

SUMMARY

The present disclosure relates to a field of display, and more particularly to a display device.

The present disclosure provides a display device. The display device includes a cover glass, a display panel, a light-absorbing ink layer and a transparent conductive layer. The cover glass is on a light-emitting side of the display panel, and has a central light-transmitting area and a peripheral light-shielding area at a periphery of the central light-transmitting area. The light-absorbing ink layer is on a side of the cover glass adjacent to the display panel, and the light-absorbing ink layer is under the peripheral light-shielding area. The transparent conductive layer is between the cover glass and the display panel, and an orthogonal projection of the transparent conductive layer on the cover glass at least partially overlaps with an orthogonal projection of the light-absorbing ink layer on the cover glass.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

Figure 1:
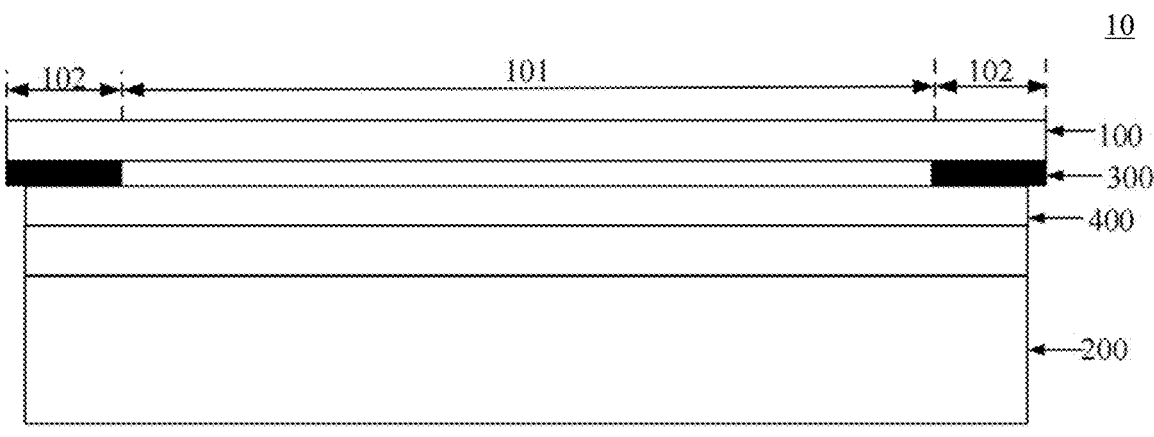
FIG. 1 is a schematic view of a display device according to an example of the present disclosure.

Through the above drawings, specific examples of the present disclosure have been shown, which will be described in more detail later. These drawings and text descriptions are not intended to limit the scope of the concept of the present disclosure in any way, but to explain the concept of the present disclosure to those skilled in the related art by referring to the specific examples.

DETAILED DESCRIPTION

Reference will now be described in detail to examples, which are illustrated in the accompanying drawings. The following description refers to the accompanying drawings in which the same numbers in different drawings represent the same or similar elements unless otherwise represented. The examples described following do not represent all examples consistent with the present disclosure. Instead, they are merely examples of devices and methods consistent with aspects of the disclosure as detailed in the appended claims.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

A cover glass in a display device usually generates static electricity (e.g., friction electrification), which tends to be conducted into a substrate in a display panel of the display device through a light-absorbing ink layer of the display device when a plastic housing is used by the display device. When the static electricity exists in the substrate of the display panel, an electric field generated by such static electricity will affect a driving circuit in the display panel, which leads to a problem of threshold voltage shift of the driving circuit, thus resulting in a poor display effect of the display device.

Referring to FIG. 1, which is a schematic view of a display device according to an example of the present disclosure. The display device may be any product or component with a display function, such as a mobile phone, a tablet computer, a television, a monitor, a notebook computer, a digital photo frame, a navigator, etc. A display device 10 may include a cover glass 100, a display panel 200, a light-absorbing ink layer 300 and a transparent conductive layer 400.

The cover glass 100 in the display device 10 may be on a light-emitting side of the display panel 200, and the cover glass 100 may have a central light-transmitting area 101 and a peripheral light-shielding area 102 at the periphery of the central light-transmitting area 101.

The light-absorbing ink layer 300 in the display device 10 may be on a side of the cover glass 100 adjacent to the display panel 200, and the light-absorbing ink layer 300 may be under the peripheral light-shielding area 102 of the cover glass 100. That is, the light-absorbing ink layer 300 may be aligned with at least a part of the peripheral light-shielding area 102 of the cover glass 100 in a direction perpendicular to the cover glass 100. In some examples, an edge of the light-absorbing ink layer 300 may be under the peripheral light-shielding area 102 of the cover glass 100.

The transparent conductive layer 400 in the display device 10 may be between the cover glass 100 and the display panel 200, and an orthogonal projection of the transparent conductive layer 400 on the cover glass 100 and an orthogonal projection of the light-absorbing ink layer 300 on the cover glass 100 may have an overlapping area. That is, the orthogonal projection of the transparent conductive layer 400 on the cover glass 100 at least partially overlaps with the orthogonal projection of the light-absorbing ink layer 300 on the cover glass 100.

In an example, the orthogonal projection of the transparent conductive layer 400 on the cover glass 100 partially overlaps with the orthogonal projection of the light-absorbing ink layer 300 on the cover glass 100. That is, a part of the orthogonal projection of the transparent conductive layer 400 on the cover glass 100 covers a part of the orthogonal projection of the light-absorbing ink layer 300 on the cover glass 100, or a part of the orthogonal projection of the transparent conductive layer 400 on the cover glass 100 covers the whole orthogonal projection of the light-absorbing ink layer 300 on the cover glass 100, or the whole orthogonal projection of the transparent conductive layer 400 on the cover glass 100 covers a part of the orthogonal projection of the light-absorbing ink layer 300 on the cover glass 100.

In another example, the orthogonal projection of the transparent conductive layer 400 on the cover glass 100 completely overlaps with the orthogonal projection of the light-absorbing ink layer 300 on the cover glass 100. That is, the orthogonal projection of the transparent conductive layer 400 on the cover glass 100 coincides with the orthogonal projection of the light-absorbing ink layer 300 on the cover glass 100.

In the example of the present disclosure, the transparent conductive layer 400 is between the light-absorbing ink layer 300 and the display panel 200, and the orthogonal projection of the transparent conductive layer 400 on the cover glass 100 at least partially overlaps with the orthogonal projection of the light-absorbing ink layer 300 on the cover glass 100. Therefore, when the cover glass 100 in the display device 10 generates static electricity, the static electricity can be conducted to the light-absorbing ink layer 300 under the peripheral light-shielding area 102 of the cover glass 100. The static electricity conducted into the light-absorbing ink layer 300 can be further conducted into the transparent conductive layer 400. Since the display panel 200 is usually provided with a whole cathode layer, the cathode layer can shield the static electricity stored in the transparent conductive layer 400. Therefore, the cathode layer can prevent such static electricity from adversely affecting light-emitting members in the display panel 200. Thus, the display device has a good display effect.

It should be noted that after the transparent conductive layer 400 is arranged between the display panel 200 and the cover glass 100, the static electricity generated by the cover glass 100 is substantially conducted into the transparent conductive layer 400, and will not be further conducted downwards into a substrate in the display panel 200. In this way, a phenomenon that an electric field generated by the static electricity conducted into the display panel 200 has adverse effects on a driving circuit in the display panel 200 is avoided.

To sum up, the examples of the present disclosure provide the display device, which includes the cover glass, the display panel, the light-absorbing ink layer and the transparent conductive layer. The transparent conductive layer is between the light-absorbing ink layer and the display panel, and the orthogonal projection of the transparent conductive layer on the cover glass at least partially overlaps with the orthogonal projection of the light-absorbing ink layer on the cover glass. Therefore, when the cover glass in the display device generates static electricity, the static electricity can be conducted to the light-absorbing ink layer under the peripheral light-shielding area of the cover glass, and the static electricity conducted into the light-absorbing ink layer can be further conducted into the transparent conductive layer, without being further conducted downwards into the substrate in the display panel. In this way, the phenomenon that the electric field generated by the static electricity conducted into the display panel has adverse effects on the driving circuit in the display panel is avoided. Since the cathode layer in the display panel can shield the static electricity stored in the transparent conductive layer, the cathode layer can prevent such static electricity from adversely affecting a light-emitting layer in the light-emitting member. Therefore, the display device has a good display effect.

In the examples of the present disclosure, there are many optional implementations of the constitution of the transparent conductive layer 400, and the following examples of the present disclosure are schematically explained by taking two optional implementations as examples.

Figure 2:
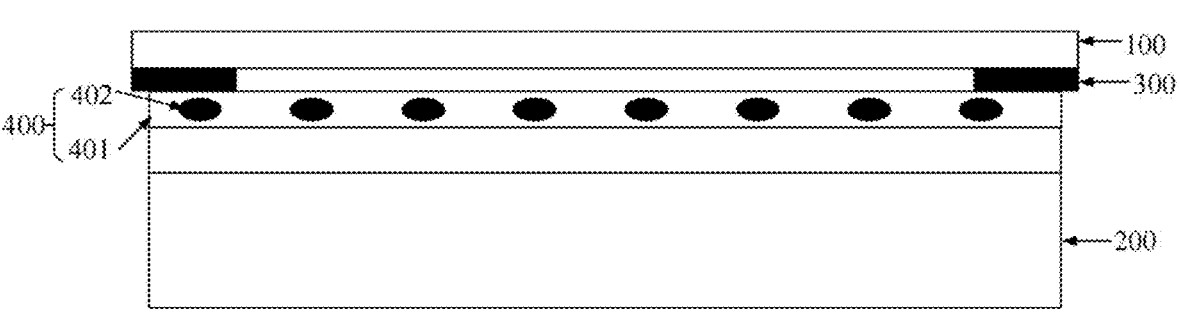
FIG. 2 is a schematic view of a display device according to another example of the present disclosure.

In a first optional implementation, referring to FIG. 2, which is a schematic view of a display device according to another example of the present disclosure, the transparent conductive layer 400 in the display device 10 may include a first transparent adhesive layer 401 and a plurality of conductive particles 402 in the first transparent adhesive layer 401. The first transparent adhesive layer 401 can be bonded to the light-absorbing ink layer 300 and the display panel 200 in the display device 10, respectively. In this case, when the cover glass 100 in the display device 10 generates static electricity, the static electricity can be conducted to the light-absorbing ink layer 300 under the peripheral light-shielding area 102 of the cover glass 100. The static electricity conducted into the light-absorbing ink layer 300 can be further conducted into the first transparent adhesive layer 401 in which the plurality of conductive particles 402 are. In this way, the static electricity can be stored in the first transparent adhesive layer 401, and the cathode layer in the display panel 200 can shield the static electricity stored in the first transparent adhesive layer 401.

Figure 3:
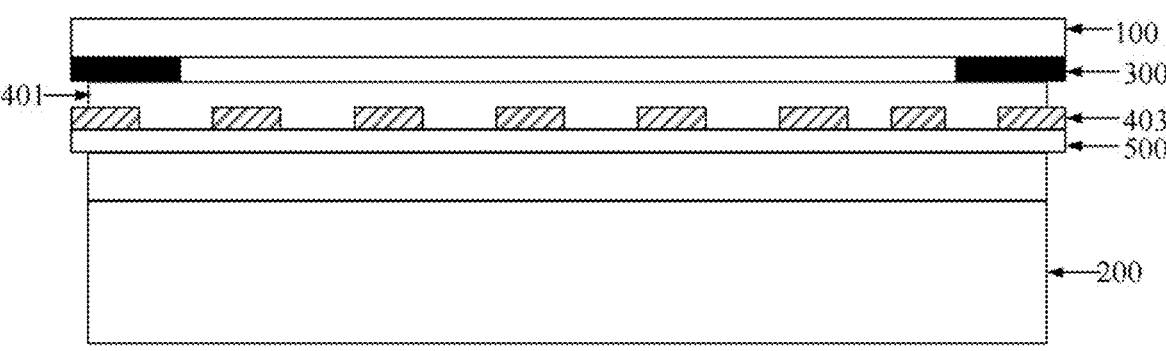
FIG. 3 is a schematic view of a display device according to another example of the present disclosure.

In a second optional implementation, referring to FIG. 3, which is a schematic view of a display device according to another example of the present disclosure. The transparent conductive layer 400 in the display device 10 may be a transparent electrode layer 403, the display device 10 may further include a bearing substrate 500 between the display panel 200 and the cover glass 100. The transparent electrode layer 403 may be on a side of the bearing substrate 500 facing away from the display panel 200. In this case, when the cover glass 100 in the display device 10 generates static electricity, the static electricity can be conducted to the light-absorbing ink layer 300 under the peripheral light-shielding area 102 in the cover glass 100. The static electricity conducted into the light-absorbing ink layer 300 can be further conducted into the transparent electrode layer 403 on the bearing substrate 500. In the present disclosure, the transparent electrode layer 403 may be an electrode structure made of Indium Tin Oxides (ITO) or Indium Zinc Oxide (IZO), which is not specifically limited in the examples of the present disclosure.

In the examples of the present disclosure, there are many optional implementations for the constitution of the transparent electrode layer 403, and the following examples of the present disclosure are schematically explained by taking three optional implementations as examples.

Figure 4:
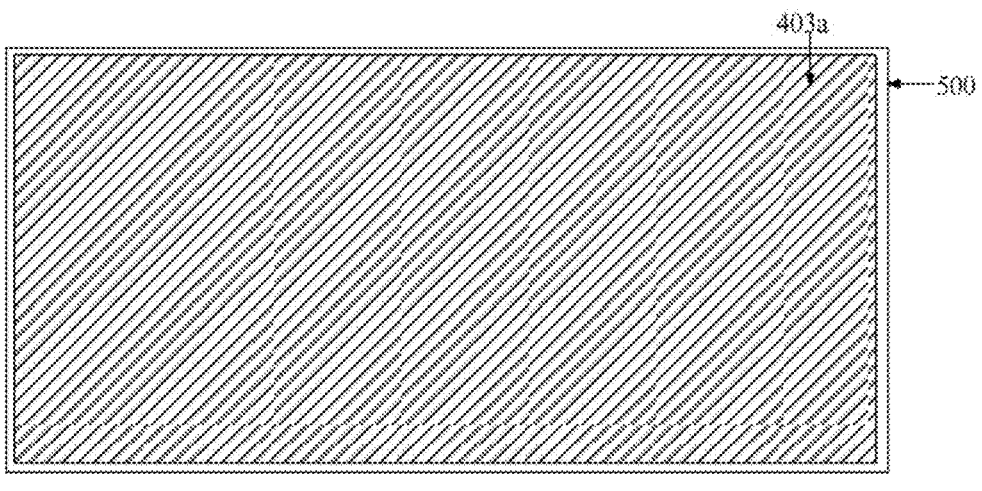
FIG. 4 is a schematic view of the distribution of a transparent electrode layer on a bearing substrate according to an example of the present disclosure.

In a first optional implementation, referring to FIG. 4, which is a schematic view of the distribution of a transparent electrode layer on a bearing substrate according to an example of the present disclosure, the transparent electrode layer 403 may include a planar electrode 403a arranged in a whole layer. In this case, by providing the whole layer of the planar electrode 403a on the bearing substrate 500, when the cover glass 100 in the display device 10 generates static electricity, the static electricity can be conducted to the light-absorbing ink layer 300 under the peripheral light-shielding area 102 of the cover glass 100. The static electricity conducted into the light-absorbing ink layer 300 can be further conducted to the planar electrode 403a arranged in the whole layer on the bearing substrate 500.

Figure 5:
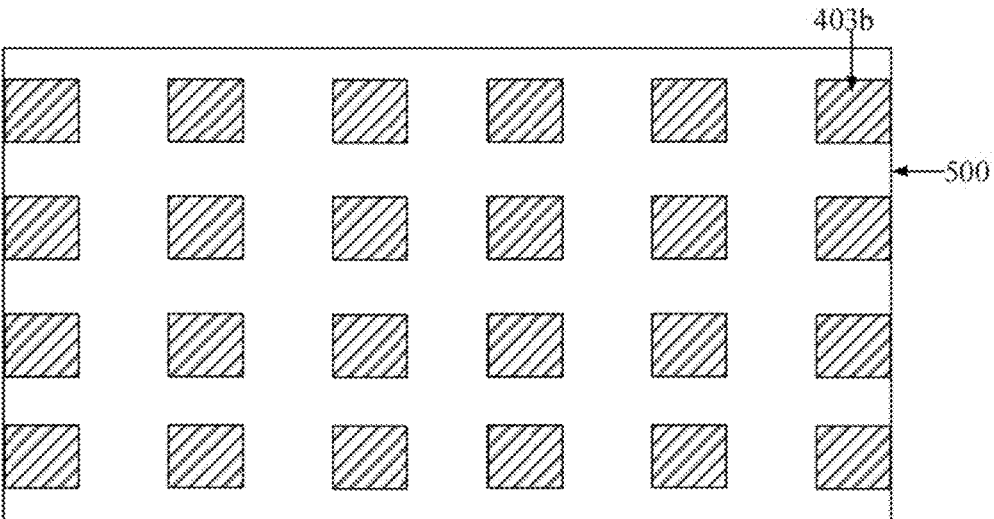
FIG. 5 is a schematic view of the distribution of a transparent electrode layer on a bearing substrate according to another example of the present disclosure.

In a second optional implementation, referring to FIG. 5, which is a schematic view of the distribution of a transparent electrode layer on a bearing substrate according to another example of the present disclosure, the transparent electrode layer 403 may include a plurality of block electrodes 403b arranged in an array. In this case, by providing the plurality of block electrodes 403b on the bearing substrate 500, when the cover glass 100 in the display device 10 generates static electricity, the static electricity can be conducted to the light-absorbing ink layer 300 under the peripheral light-shielding area 102 of the cover glass 100. The static electricity conducted into the light-absorbing ink layer 300 can be further conducted into the plurality of block electrodes 403b on the bearing substrate 500.

Figure 6:
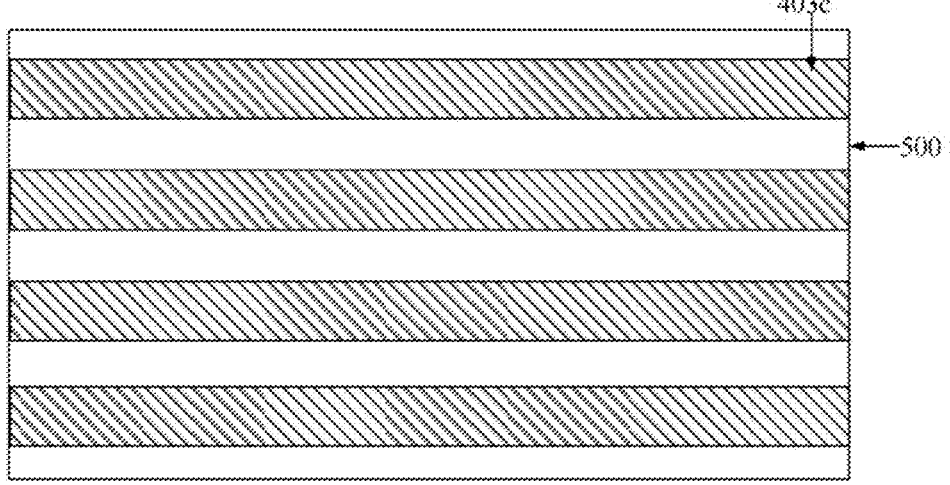
FIG. 6 is a schematic view of the distribution of a transparent electrode layer on a bearing substrate according to another example of the present disclosure.
Figure 7:
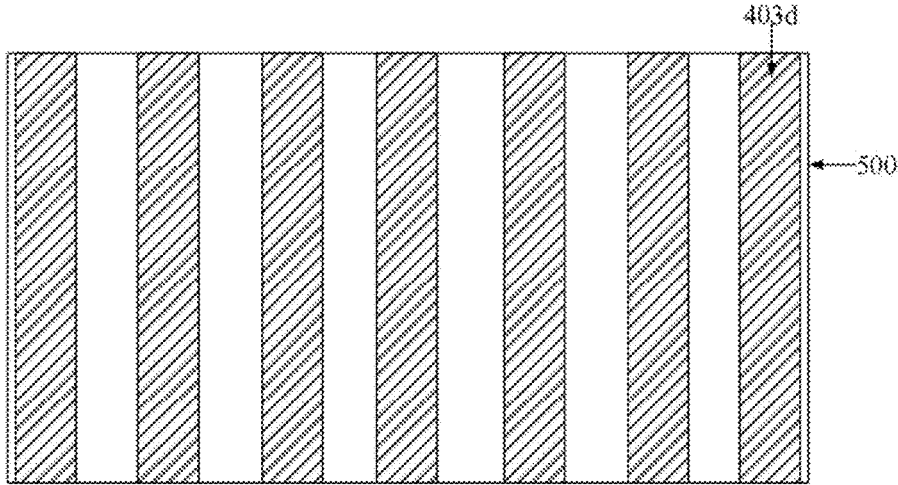
FIG. 7 is a schematic view of the distribution of a transparent electrode layer on a bearing substrate according to another example of the present disclosure.
Figure 8:
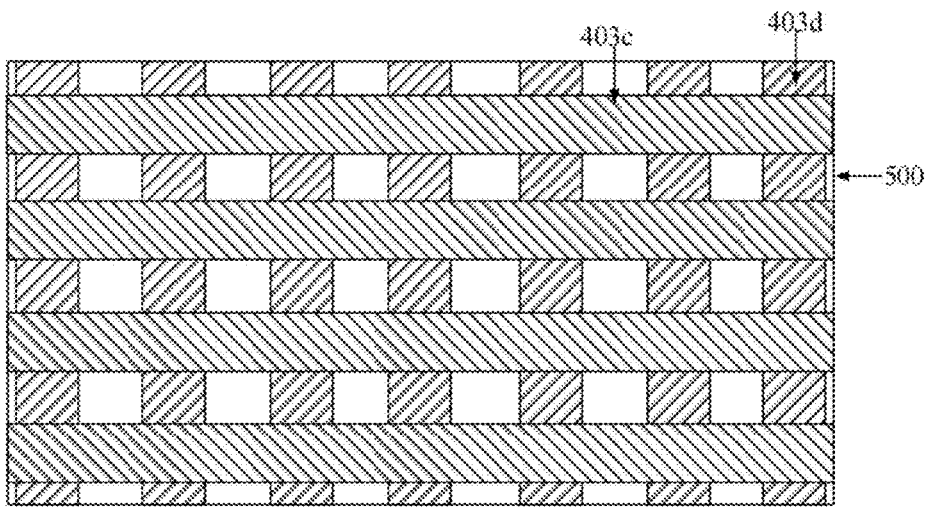
FIG. 8 is a schematic view of the distribution of a transparent electrode layer on a bearing substrate according to another example of the present disclosure.

In a third optional implementation, the transparent electrode layer 403 may include: a plurality of first strip electrodes 403c arrayed in a first direction, and/or a plurality of second strip electrodes 403d arrayed in a second direction. The first direction and the second direction can intersect with each other. In the present disclosure, referring to FIG. 6, which is a schematic view of the distribution of a transparent electrode layer on a bearing substrate according to another example of the present disclosure, the transparent electrode layer 403 may include a plurality of first strip electrodes 403c arrayed in a first direction. Or, referring to FIG. 7, which is a schematic view of the distribution of a transparent electrode layer on a bearing substrate according to another example of the present disclosure, the transparent electrode layer 403 may include a plurality of second strip electrodes 403d arrayed in a second direction. Or, referring to FIG. 8, which is a schematic view of the distribution of a transparent electrode layer on a bearing substrate according to another example of the present disclosure, the transparent electrode layer 403 may include a plurality of first strip electrodes 403c arrayed in a first direction and a plurality of second strip electrodes 403d arrayed in a second direction, which is not specifically limited in the examples of the present disclosure.

In some examples of the present disclosure, when the transparent electrode layer 403 includes the plurality of first strip electrodes 403c and the plurality of second strip electrodes 403d, there are two possibilities to connect the plurality of first strip electrodes 403c with the plurality of second strip electrodes 403d, and the following examples of the present disclosure are schematically explained by taking the following two possibilities as examples.

In a first possibility, the plurality of first strip electrodes 403c are electrically connected to the plurality of second strip electrodes 403d, that is, the transparent electrode layer 403 may be a net structure including the plurality of first strip electrodes 403c and the plurality of second strip electrodes 403d. The plurality of first strip electrodes 403c arrayed in the first direction may be perpendicular to the plurality of second strip electrodes 403d arrayed in the second direction.

In a second possibility, the plurality of first strip electrodes 403c are insulated from the plurality of second strip electrodes 403d, one of the first strip electrode 403c and the second strip electrode 403d may be a touch driving electrode, and the other one of the first strip electrode 403c and the second strip electrode 403d may be a touch sensing electrode. In this case, the transparent electrode layer 403 can not only store the static electricity generated in the cover glass 100, but also prevent the static electricity from adversely affecting the display effect of the display device. In addition, the first strip electrode 403c and the second strip electrode 403d in the transparent electrode layer 403 can be used as the touch driving electrode and the touch sensing electrode, respectively, so that the display panel 200 has a function of touch display. That is, it does not need to integrate other touch layers on the display panel 200, so that the overall thickness of the display device 10 is small.

For example, the plurality of first strip electrodes 403c arrayed in the first direction are touch driving electrodes, and the plurality of second strip electrodes 403d arrayed in the second direction are touch sensing electrodes; or, the plurality of first strip electrodes 403c arrayed in the first direction are touch sensing electrodes, and the plurality of second strip electrodes 403d arrayed in the second direction are touch driving electrodes, which is not specifically limited in the examples of the present disclosure. The first direction is a transverse direction and the second direction is a longitudinal direction; or, the first direction is a longitudinal direction and the second direction is a transverse direction. Each two adjacent touch sensing electrodes and each two adjacent touch driving electrodes enclose a touch area.

In the examples of the present disclosure, when the transparent electrode layer 403 includes the plurality of block electrodes 403b, and the plurality of block electrodes 403b serve as touch electrodes, the display device 10 may further include a plurality of touch signal lines electrically connected to the plurality of block electrodes 403*b* in a one-to-one correspondence. In this case, i.e., the plurality of block electrodes 403*b* are used as the touch electrodes, when a finger or a stylus touches a display surface of the display device 10, a capacitance value at a position of the block electrode 403*b* at a touch point changes. In the present disclosure, the display device 10 further includes a touch integrated circuit (IC) electrically connected to the plurality of touch signal lines, and the touch IC is used to acquire a change of the capacitance value at the position of each block electrode.

In some examples of the present disclosure, for the structure of the bearing substrate 500 in the display device 10, the following examples of the present disclosure are schematically explained by taking two optional implementations as examples.

Figure 9:
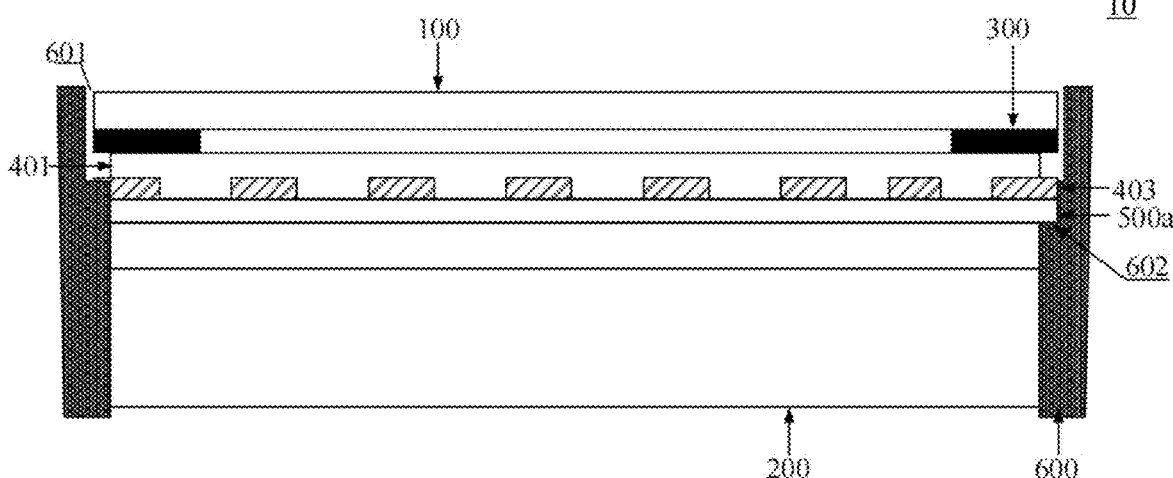
FIG. 9 is a schematic view of a display device according to another example of the present disclosure.

In a first optional implementation, referring to FIG. 9, which is a schematic view of a display device according to another example of the present disclosure, the bearing substrate 500 may be a flexible substrate 500*a*, and the display device 10 may further include the first transparent adhesive layer 401 between the transparent electrode layer 403 and the cover glass 100, and the first transparent adhesive layer 401 may be bonded to the transparent electrode layer 403 and the cover glass 100 respectively. A side surface of the flexible substrate 500*a* may protrude beyond a side surface of the first transparent adhesive layer 401. That is, a periphery of the first transparent adhesive layer 401 may be retracted relative to a periphery of the flexible substrate 500*a*. A part of the flexible substrate 500*a* under the peripheral light-shielding area 102 of the cover glass 100 (that is, a part of the flexible substrate 500*a* aligned with the peripheral light-shielding area 102 of the cover glass 100) is bent, the bent part of the flexible substrate 500*a* surrounds the first transparent adhesive layer 401, and the transparent electrode layer 403 on the bent part of the flexible substrate 500*a* can be in contact with the light-absorbing ink layer 300. In this case, by configuring the bearing substrate 500 bearing the transparent electrode layer 403 as the flexible substrate 500*a*, the part of the flexible substrate 500*a* under the peripheral light-shielding area 102 of the cover glass 100 can be bent, and the transparent electrode layer 403 on the bent part of the flexible substrate 500*a* can be in contact with the light-absorbing ink layer 300. Thus, when the cover glass 100 in the display device 10 generates static electricity, the static electricity can be conducted to the light-absorbing ink layer 300 under the peripheral light-shielding area 102 of the cover glass 100. The static electricity conducted into the light-absorbing ink layer 300 can be conducted into the flexible substrate 500*a* provided with the transparent electrode layer 403 more quickly, that is, the efficiency of conducting the static electricity to the flexible substrate 500*a* is effectively improved.

In the present disclosure, the flexible substrate 500*a* may be a lamellar structure made of polymethyl methacrylate, polyethylene terephthalate, or cycloolefin polymer. It should be noted that this is not specifically limited in the examples of the present disclosure.

In the examples of the present disclosure, as shown in FIG. 9, the display device may further include a housing 600, and the housing 600 may have an accommodating cavity 601 for mounting the display panel 200. The housing 600 has an inner wall, and the inner wall defines the accommodating cavity 601. A step structure 602 may be provided in the accommodation cavity 601 of the housing 600. That is, the inner wall of the housing 600 has the step structure 602. The step structure 602 in the accommodating cavity 601 may be configured to abut against the part of the flexible substrate 500*a* under the peripheral light-shielding area 102 of the cover glass 100 when the display panel 200 is mounted in the accommodating cavity 601 of the housing 600, so that the part of the flexible substrate 500*a* under the peripheral light-shielding area 102 of the cover glass 100 is bent. In this case, after the display panel 200 is mounted in the accommodating cavity 601 of the housing 600, the part of the flexible substrate 500*a* under the peripheral light-shielding area 102 of the cover glass 100 abuts against the step structure 602 on the inner wall of the housing 600, so that a peripheral part of the flexible substrate 500*a* is subjected to a force toward the light-absorbing ink layer 300 exerted by the step structure 602 and thus is bent into contact with the light-absorbing ink layer 300.

Figure 10:
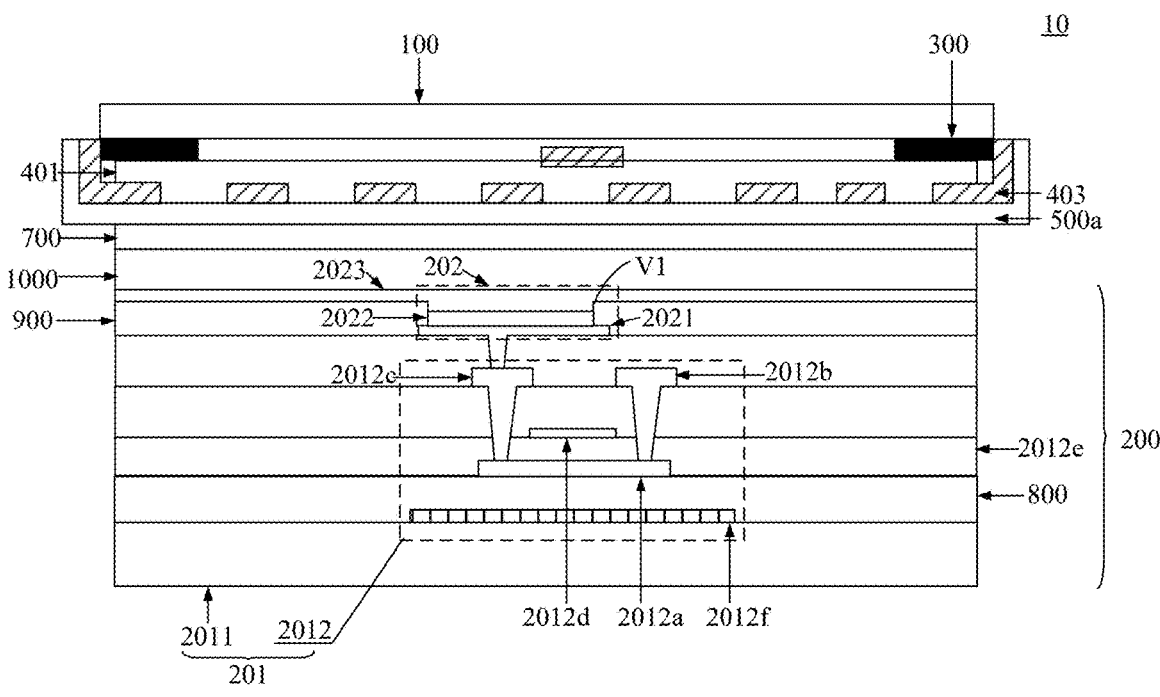
FIG. 10 is a schematic view of a display device according to another example of the present disclosure.

In some examples of the present disclosure, referring to FIG. 10, which is a schematic view of a display device according to another example of the present disclosure. The display device 10 may further include a second transparent adhesive layer 700, and the second transparent adhesive layer 700 may be between the flexible substrate 500*a* and the display panel 200. The second transparent adhesive layer 700 may be bonded to the flexible substrate 500*a* and the display panel 200, respectively. In this case, the flexible substrate 500*a* is bonded to the display panel 200 through the second transparent adhesive layer 700, which improves the stability of the connection between the flexible substrate 500*a* and the display panel 200.

Figure 11:
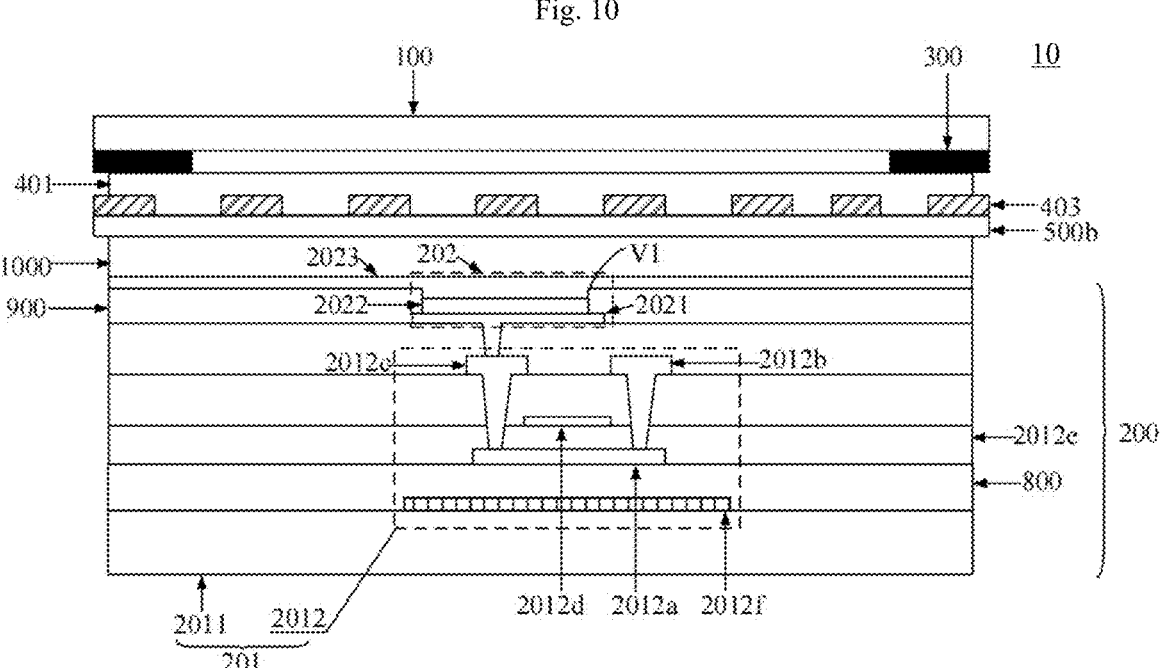
FIG. 11 is a schematic view of a display device according to another example of the present disclosure.

In some other examples of the present disclosure, referring to FIG. 11, which is a schematic view of a display device according to another example of the present disclosure, the bearing substrate 500 may be a polarizer 500*b* fixed on a light-emitting side of the display panel 200. In this case, by directly integrating the transparent electrode layer 403 on the polarizer 500*b*, the polarizer 500*b* can reduce the amount of external light, which enters the display panel 200, exiting from the light-emitting side of the display panel 200 after being reflected by an internal structure of the display panel 200, and the transparent electrode layer 403 on the polarizer 500*b* can store the static electricity generated in the cover glass 100.

In the examples of the present disclosure, the display device 10 may further include a flexible printed circuit board electrically connected to the display panel 200, the flexible printed circuit board may have a cathode power signal terminal, and the cathode power signal terminal may be electrically connected to the transparent conductive layer 400. In this case, since the cathode power signal terminal on the flexible printed circuit board is electrically connected with the transparent conductive layer 400, the flexible printed circuit board is electrically connected with the display panel 200 and the transparent conductive layer 400, respectively, and a potential difference between the transparent conductive layer 400 and the display panel 200 can be effectively eliminated, so that the static electricity stored in the transparent conductive layer 400 has little influence on the display panel 200.

In some examples of the present disclosure, as shown in FIGS. 10 and 11, the display panel 200 in the display device 10 may include a base board 201 and a light-emitting member 202 on the base board 201. In the present disclosure, the base board 201 in the display panel 200 may include a substrate 2011 and a pixel driving circuit 2012 on the substrate 2011. A plurality of pixel driving circuits 2012 are usually in the base board 201, the plurality of pixel driving circuits 2012 may be in a one-to-one correspondence with a plurality of light-emitting members 202, and each pixel driving circuit 2012 may be electrically connected with a corresponding light-emitting member 202.

For example, as shown in FIG. 10 and FIG. 11, the pixel driving circuit 2012 includes at least one thin film transistor and at least one storage capacitor. The thin film transistor may include an active layer 2012*a*, a source electrode 2012*b*, a drain electrode 2012*c*, a gate electrode 2012*d*, a gate insulating layer 2012*e* and a light shielding layer 2012*f*. The light shielding layer 2012*f* and the active layer 2012*a* can be insulated by an insulating layer 800, and an orthogonal projection of the active layer 2012*a* on the substrate 2011 is within an orthogonal projection of the light shielding layer 2012*f* on the substrate 2011. In this way, the light shielding layer 2012*f* can shield the active layer 2012*a*, so as to avoid the phenomenon of voltage threshold shift of the active layer 2012*a* under the irradiation of light. The active layer 2012*a* can be insulated from the gate electrode 2012*d* by the gate insulating layer 2012*e*, and the active layer 2012*a* is electrically connected with the source electrode 2012*b* and the drain electrode 2012*c*, respectively.

In the present disclosure, as shown in FIG. 10 and FIG. 11, the light-emitting member 202 may include an anode layer 2021, a light-emitting layer 2022, and a cathode layer 2023 which are stacked. One of the source electrode 2012*b* and the drain electrode 2012*c* in the pixel driving circuit 2012 may be electrically connected to the anode layer 2021 in the light-emitting member 202. In the present disclosure, when a driving voltage is applied to the anode layer 2021 through the pixel driving circuit 2012 and a cathode voltage is applied to the cathode layer 2023, the light-emitting layer 2022 between the anode layer 2021 and the cathode layer 2023 can emit light. For example, the display panel 200 in the display device 10 may be an organic light-emitting diode (OLED) display panel.

In the examples of the present disclosure, as shown in FIG. 10 and FIG. 11, the display panel 200 may further include a pixel delimiting layer 900. The pixel delimiting layer has a pixel opening V1, and the light-emitting member 202 may be in the pixel opening V1.

In some examples of the present disclosure, as shown in FIG. 10 and FIG. 11, the display device 10 may further include an inorganic encapsulation layer 1000 between the display panel 200 and the bearing substrate 500, the inorganic encapsulation layer 1000 may be used to encapsulate the light-emitting member 202, so as to isolate the light-emitting member 202 from the outside air and prevent the light-emitting layer 2022 in the light-emitting member 202 from being eroded by moisture and oxygen in the air.

To sum up, the examples of the present disclosure provide the display device, which includes the cover glass, the display panel, the light-absorbing ink layer and the transparent conductive layer. The transparent conductive layer is between the light-absorbing ink layer and the display panel, and the orthogonal projection of the transparent conductive layer on the cover glass at least partially overlaps with the orthogonal projection of the light-absorbing ink layer on the cover glass. Therefore, when the cover glass in the display device generates static electricity, the static electricity can be conducted to the light-absorbing ink layer under the peripheral light-shielding area of the cover glass, and the static electricity conducted into the light-absorbing ink layer can be further conducted into the transparent conductive layer, without being further conducted downwards into the substrate in the display panel. Therefore, the phenomenon that the electric field generated by the static electricity conducted into the display panel has adverse effects on the driving circuit in the display panel is avoided. Since the cathode layer in the display panel can shield the static electricity stored in the transparent conductive layer, the cathode layer can prevent such static electricity from adversely affecting the light-emitting layer in the light-emitting member. Therefore, the display device has good display effect.

Examples of the present disclosure provide a display device, and the display device includes a cover glass, a display panel, a light-absorbing ink layer and a transparent conductive layer. The cover glass is located on a light-emitting side of the display panel, and has a central light-transmitting area and a peripheral light-shielding area located at a periphery of the central light-transmitting area. The light-absorbing ink layer is located on a side of the cover glass adjacent to the display panel, and the light-absorbing ink layer is located under the peripheral light-shielding area. The transparent conductive layer is located between the cover glass and the display panel, and an orthogonal projection of the transparent conductive layer on the cover glass and an orthogonal projection of the light-absorbing ink layer on the cover glass have an overlapping area.

In some examples, the transparent conductive layer includes a first transparent adhesive layer and a plurality of conductive particles distributed in the first transparent adhesive layer, and the first transparent adhesive layer is bonded with the light-absorbing ink layer and the display panel, respectively.

In some examples, the transparent conductive layer is a transparent electrode layer, the display device further includes a bearing substrate located between the display panel and the cover glass, and the transparent electrode layer is located on a side of the bearing substrate facing away from the display panel.

In some examples, the transparent electrode layer includes a planar electrode arranged in a whole layer; or, the transparent electrode layer includes a plurality of block electrodes arranged in an array; or, the transparent electrode layer includes a plurality of first strip electrodes arrayed in a first direction, and/or a plurality of second strip electrodes arrayed in a second direction, in which the first direction intersects with the second direction.

In some examples, when the transparent electrode layer includes the plurality of first strip electrodes and the plurality of second strip electrodes, the plurality of first strip electrodes are electrically connected to the plurality of second strip electrodes; or, the plurality of first strip electrodes are insulated from the plurality of second strip electrodes, and one of the first strip electrode and the second strip electrode is a touch driving electrode, and the other one of the first strip electrode and the second strip electrode is a touch sensing electrode.

In some examples, when the transparent electrode layer includes the plurality of block electrodes and the block electrodes serve as touch electrodes, the display device further includes a plurality of touch signal lines electrically connected with the plurality of block electrodes in a one-to-one correspondence.

In some examples, the bearing substrate is a flexible substrate, the display device further includes a first transparent adhesive layer located between the transparent electrode layer and the cover glass, and the first transparent adhesive layer is bonded with the transparent electrode layer and the cover glass, respectively. A side surface of the flexible substrate protrudes beyond a side surface of the first transparent adhesive layer. After a part of the flexible substrate located under the peripheral light-shielding area is bent, the bent part of the flexible substrate is distributed around the first transparent adhesive layer, and the transparent electrode layer distributed on the bent part of the flexible substrate is in contact with the light-absorbing ink layer.

In some examples, the display device further includes a housing, the housing has an accommodating cavity for mounting the display panel, and a side wall of the accommodating cavity has a step structure. The step structure is configured to abut against the part of the flexible substrate located under the peripheral light-shielding area after the display panel is installed in the accommodating cavity, so that the part of the flexible substrate located under the peripheral light-shielding area is bent.

In some examples, the bearing substrate is a polarizer fixed on a light-emitting side of the display panel.

In some examples, the display device further includes a flexible printed circuit board electrically connected with the display panel, the flexible printed circuit board has a cathode power signal terminal, and the cathode power signal terminal is electrically connected with the transparent conductive layer.

In the present disclosure, terms "first" and "second" are only used for the purpose of description and cannot be understood as indicating or implying relative importance. The term "a plurality of" means two or more than two, unless otherwise specifically defined.

The above descriptions only relate to illustrative examples of the present disclosure and shall not be understood as limitation to the present disclosure, and any modification, equivalent substitution, improvement, etc. made within the spirit and principle of the present disclosure shall be included in the protection scope of the present disclosure.

What is claimed is:

1. A display device, comprising:
a display panel;
a cover glass disposed on a light-emitting side of the display panel, wherein the cover glass comprises a central light-transmitting area and a peripheral light-shielding area at a periphery of the central light-transmitting area;
a light-absorbing ink layer disposed on a side of the cover glass adjacent to the display panel, wherein the light-absorbing ink layer is disposed under the peripheral light-shielding area; and
a transparent conductive layer disposed between the cover glass and the display panel, wherein an orthogonal projection of the transparent conductive layer on the cover glass at least partially overlaps with an orthogonal projection of the light-absorbing ink layer on the cover glass;
wherein the transparent conductive layer is a transparent electrode layer, the display device further comprises a bearing substrate between the display panel and the cover glass, and the transparent electrode layer is on a side of the bearing substrate facing away from the display panel;
wherein the bearing substrate is a flexible substrate, the display device further comprises a first transparent adhesive layer between the transparent electrode layer and the cover glass, and the first transparent adhesive layer is bonded with the transparent electrode layer and the cover glass, respectively,
wherein a side surface of the flexible substrate protrudes beyond a side surface of the first transparent adhesive layer, a part of the flexible substrate under the peripheral light-shielding area is a bent part, the bent part of the flexible substrate surrounds the first transparent adhesive layer, and the transparent electrode layer on the bent part of the flexible substrate is in contact with the light-absorbing ink layer.

2. The display device according to claim 1, wherein the transparent electrode layer comprises a planar electrode arranged in a whole layer.

3. The display device according to claim 1, wherein the transparent electrode layer comprises a plurality of block electrodes arranged in an array.

4. The display device according to claim 3, wherein the plurality of block electrodes serve as touch electrodes and are configured to be electrically connected to a plurality of touch signal lines in a one-to-one correspondence.

5. The display device according to claim 1, wherein the transparent electrode layer comprises a plurality of first strip electrodes arrayed in a first direction.

6. The display device according to claim 1, wherein the transparent electrode layer comprises a plurality of second strip electrodes arrayed in a second direction.

7. The display device according to claim 1, wherein the transparent electrode layer comprises a plurality of first strip electrodes arrayed in a first direction, and a plurality of second strip electrodes arrayed in a second direction, wherein the first direction intersects with the second direction.

8. The display device according to claim 7, wherein the plurality of first strip electrodes are electrically connected with the plurality of second strip electrodes.

9. The display device according to claim 7, wherein the plurality of first strip electrodes are insulated from the plurality of second strip electrodes, one of the first strip electrode and the second strip electrode is a touch driving electrode, and the other one of the first strip electrode and the second strip electrode is a touch sensing electrode.

10. The display device according to claim 9, wherein each two adjacent touch sensing electrodes and each two adjacent touch driving electrodes enclose a touch area.

11. The display device according to claim 1, wherein the display device further comprises a housing having an accommodating cavity for mounting the display panel, the housing comprises an inner wall defining the accommodating cavity, and the inner wall has a step structure,
wherein the step structure is configured to abut against the part of the flexible substrate under the peripheral light-shielding area when the display panel is mounted in the accommodating cavity, and the part of the flexible substrate under the peripheral light-shielding area is bent.

12. The display device according to claim 1, wherein the flexible substrate is a lamellar structure made of at least one of polymethyl methacrylate, polyethylene terephthalate, or cycloolefin polymer.

13. The display device according to claim 1, wherein the display device further comprises a second transparent adhesive layer, the second transparent adhesive layer is between the flexible substrate and the display panel, and the second transparent adhesive layer is bonded to the flexible substrate and the display panel, respectively.

14. The display device according to claim 1, wherein the bearing substrate is a polarizer fixed on the light-emitting side of the display panel.

15. The display device according to claim 1, wherein the transparent electrode layer is an electrode structure made of at least one of Indium Tin Oxides or Indium Zinc Oxide.

16. The display device according to claim 1, wherein the display panel in the display device comprises a base board and a light-emitting member on the base board, the base board comprises a substrate and a pixel driving circuit on the substrate, and the pixel driving circuit is electrically connected with the light-emitting member, the pixel driving circuit comprises at least one thin film transistor, the at least one thin film transistor comprises an active layer and a light shielding layer, the light shielding layer and the active layer are insulated by an insulating layer, and an orthogonal projection of the active layer on the substrate is within an orthogonal projection of the light shielding layer on the substrate.

17. The display device according to claim 16, wherein the display device further comprises an inorganic encapsulation layer between the display panel and the bearing substrate, and the inorganic encapsulation layer is configured to encapsulate the light-emitting member.

\* \* \* \* \*